United States Patent [19]
Nakane et al.

[11] Patent Number: 5,252,921
[45] Date of Patent: Oct. 12, 1993

[54] NOISE CANCELING HIGH-SENSITIVE MAGNETOMETER

[75] Inventors: Hideaki Nakane, 617-152, Yokokawa-cho, Hachioji-shi, Tokyo; Juan C. Cubillos, Kokubunji; Eiichi Goto, Fujisawa, all of Japan

[73] Assignees: Research Development Corporation of Japan; Hideaki Nakane, both of Tokyo, Japan; a part interest

[21] Appl. No.: 669,633

[22] Filed: Mar. 14, 1991

[30] Foreign Application Priority Data

Mar. 15, 1990 [JP] Japan ................. 2-65060

[51] Int. Cl.$^5$ ................. G01R 33/16; G01R 33/35
[52] U.S. Cl. ................. 324/248; 505/846
[58] Field of Search ............ 324/248, 225; 505/845, 505/846; 257/31; 307/306

[56] References Cited

U.S. PATENT DOCUMENTS

| | | | |
|---|---|---|---|
| 4,280,095 | 7/1981 | Hinton | 324/248 |
| 4,588,947 | 5/1986 | Ketchen | 324/248 |
| 4,851,776 | 7/1989 | Goto et al. | 324/248 |
| 5,053,707 | 10/1991 | Yuyama et al. | 324/262 |

OTHER PUBLICATIONS

IEEE Transactions on Magnetics, vol. MAG-17, No. 1, Jan. 1981, pp. 400-403, J. M. Jaycox, et al., "Planar Coupling Scheme for Ultra Low Noise DC Squids".

IBM Technical Disclosure Bulletin, vol. 29, No. 2, Jul. 1986, p. 510, "DC Squid as an Enhanced Magnetometer".

Patent Abstracts of Japan, vol. 015, No. 083, (P-1171), Feb. 26, 1991, & JP-A-2 298 878, Dec. 11, 1990, N. Fujimaki, "Superconducting Device".

Primary Examiner—Walter E. Snow
Attorney, Agent, or Firm—Oblon, Spivak, McClelland, Maier & Neustadt

[57] ABSTRACT

A high-sensitive magnetometer has two SQUIDs each comprising a superconducting loop with one or more Josephson junctions and also has a coil comprising a continuous loop for providing magnetic flux of input signals to each of the SQUIDs in opposite directions. The magnetic flux of the input signals is detected by sums of output voltages of the SQUIDs. Magnetic flux noises equally applied on the two SQUID are cancelled by the continuous loop and at addition of the output voltages of the SQUIDs, thus large output signals can be obtained because sums of the two SQUID output signals are obtained.

6 Claims, 2 Drawing Sheets

TO PICK-UP COIL

TO PICK-UP COIL

NOISE CANCELING HIGH-SENSITIVE MAGNETOMETER

FIELD OF THE INVENTION

This invention relates to magnetometers using the superconducting quantum interference device(SQUID) and particurally to magnetometers which make it possible to detect very weak magnetic flux with low noises and high sensitivity.

BACKGROUND OF THE INVENTION

The magnetometers, each of which uses the SQUID comprising a superconducting loop having one or more Josephson junctions, have been proposed(for example, see IEEE. Trans. Devices, ED27, No.10(1980) pp.1896~1908.). The magnetometers can detect very weak magnetic flux and can be used in the fields of detection of biological magnetic field, geophysics, surveying of natural resouces and so on.

SUMMARY OF THE INVENTION

It has been desired for the SQUID magnetometer to detect magnetic flux with high sensitivity and low noises. In other words, the object of this invention is to improve the sensivity of the SQUID magnetometer and reduce the equivalent input noises thereof.

The above problem will be solved by this high-sensitive magnetometer which has two SQUIDs, each comprising a superconducting loop with one or more Josephson junctions and also has a coil comprising a continuous loop for providing magnetic flux of input signals to each of the SQUIDs in opposite directions.

As the SQUID, a DC-SQUID having a superconducting loop with two or more Josephson junctions or an RF-SQUID having a superconducting loop with one Josephson junction can be used.

According to this invention, magnetic flux noises present inside the SQUID loops are mutually sensed by each SQUID. These noises generate output voltages across each SQUID. But, these voltages can be added destructively. Thus the magnetic flux noises are cancelled. In contrast, signals produce constructive additions of voltages. Then the signals create large output voltages with higher output impedance, as compared with the case where only one SQUID is used.

DETAILED DESCRIPTION OF THE INVENTION

Figure 1:
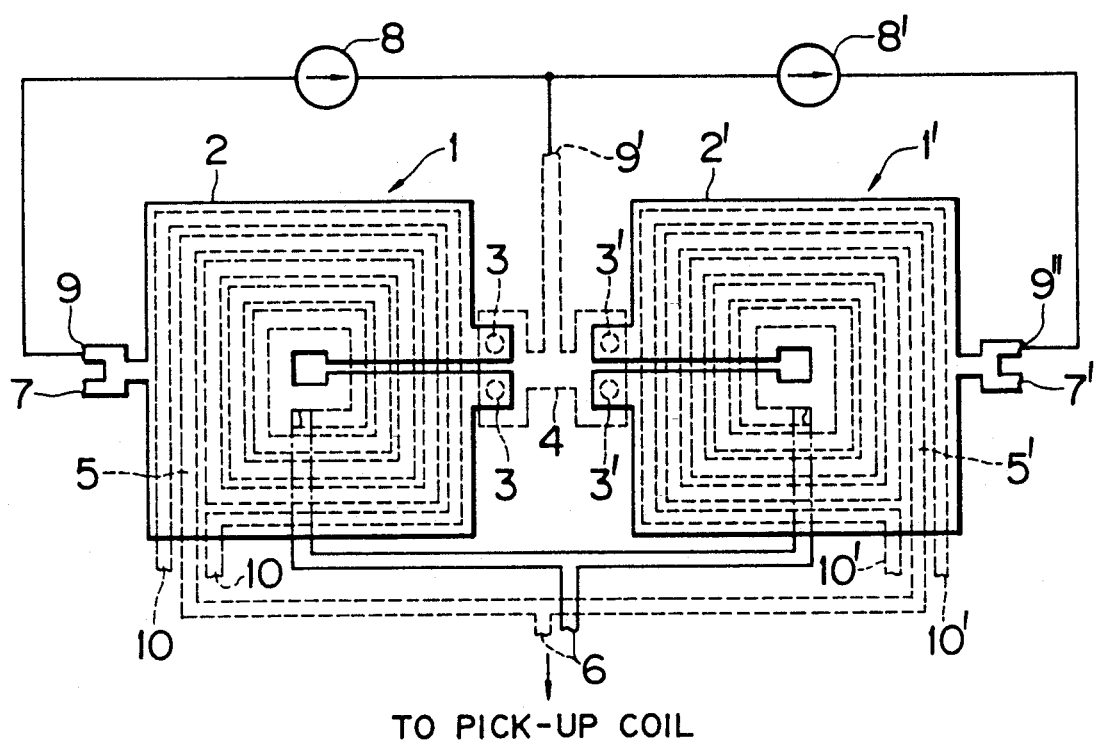
FIG. 1 shows a circuit diagram of an example of this invention.

Hereinafter, we will explain an example of this invention with reference to the accompanying drawings. FIG. 1 shows a circuit diagram of a magnetometer according to this invention. In this example, the SQUIDs are DC-SQUIDs 1 and 1' made by two superconducting films and and an insulation film therebetween.

The DC-SQUIDs 1 and 1' are respectively formed by connecting superconducting films 2 and 2' to another superconducting film 4 through two Josephson junctions 3 and 3'. Close to the superconducting films 2 and 2' of the DC-SQUIDs 1 and 1', provided are input coils 5 and 5', the winding directions of which are opposite. These input coils 5 and 5' are connected in serial to form one loop and a terminal 6 is led out from the middle point of the loop. When signals caught by a pick-up coil are inputted from the terminal 6 of the input coils, these signals are equally divided and introduced into the input coils 5 and 5'. Since the winding directions of the coils 5 and 5' are opposite, the directions of magnetic flux passing through the respective DC-SQUIDs become opposite. The output signals of the magnetometer are taken across the terminals 7 and 7' as output voltages of two DC-SQUIDs. The bias currents from two direct current sources 8 and 8' are supplied to the DC-SQUIDs 1 and 1' through terminals 9, 9' and 9". The directions of the bias currents are set so that voltages of opposite polarities with respect to the portion 4 are generated at the terminals 7 and 7'. The reference numerals 10 and 10' are coils for feedback modulation or extra input coils.

In the magnetometer as constructed above, the magnetic flux transmittance between the input coils 5 and 5' has an ability for removing magnetic flux noises inside the DC-SQUIDs 1 and 1'. In this point, it is preferable that the couplings between the SQUIDs 1 and 1' and the input coils 5 and 5' are the tight couplings. The flux noises are removed as described below.

Figure 2:
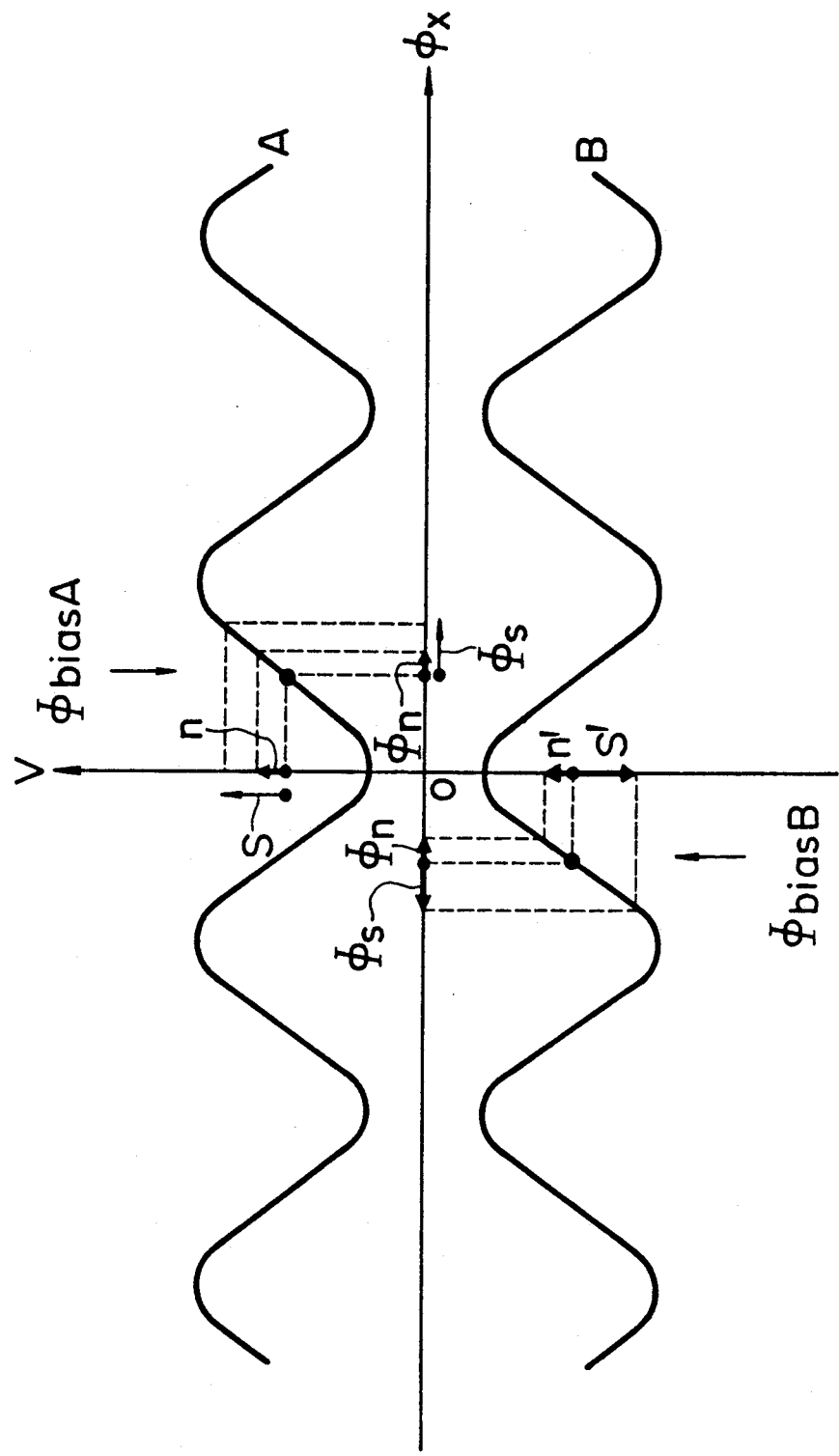
FIG. 2 shows a graph showing a relation, in the example of FIG. 1, between a magnetic flux noise and output voltages with respect to the common ground ("4" in FIG. 1).

FIG. 2 shows a characteristic between magnetic flux and detection voltages in the example shown in FIG. 1. The curves A and B show the output voltages of the SQUID 1 and the SQUID 1', respectively, with respect to a voltage reference at the terminal 4. The DC-SQUIDs have to be biased into an operating point where a flux applied at the input results in a voltage variation across the terminals 7-7'. An example of how the magnetometer can be biased is shown in FIG. 2. The SQUID 1 is biased by $\Phi$ biasA and the SQUID 1' by $\Phi$ biasB.

The respective output voltages corresponding to a magnetic flux noise $\Phi$ n inside the SQUIDs 1 and 1' are indicated by n and n'. By measuring voltage across 7 and 7', the voltages n and n'(voltages produced by the magnetic flux noise $\Phi$ n) are cancelled.

On the other hand, the signal magnetic flux $\Phi$ s is applied to the SQUIDs in opposite directions. By measuring the voltage across 7 and 7', the signal voltages S and S' are added constructively, resulting in a large output voltage swing and a large output impedance as compared with the case that a single DC-SQUID is used.

In the above example, the invention has been described concerning the magnetometer using the DC-SQUIDs. The magnetometer using the RF-SQUIDs can be also constructed according to the same principle and brings the same advantages. The output signals of the magnetometer using the RF-SQUIDs can be obtained by adding output voltages generated across resonance(tank) circuits which are magnetically connected to the respective RF-SQUIDs through output coils of the corresponding resonance circuits. Since the circumferential circuits such as the resonance circuits magnetically connected to RF-SQUIDs through the output coils and an alternative current magnetic flux bias supply means for supplying an alternative current magnetic flux bias to the RF-SQUIDs through the resonance circuits are well known to those skilled in the art, these are not explained in detail herein. If necessary, refer to "Introduction to cryo-electronics" written by Akira Nakamura, Published by Ohm-sha(In Japanese).

According to this invention, high-sensitive magnetometers can be realized. Therefore, eminent advantages can be obtained in diagnoses using the biological magnetic measurements, magnetic inspection of products and so on.

What is claimed is:

1. A high-sensitive magnetometer which has two SQUIDs disposed in a single plane each comprising a superconducting loop with one or more Josephson junctions, said magnetometer also having a coil in the form of a continuous loop connected to an input terminal, said coil branching into two oppositely wound portions, wherein said two oppositely wound portions are provided to respective SQUIDs for supplying magnetic flux input signals to said two SQUIDs, said magnet flux input signals being supplied to said input terminal in opposite directions, whereby flux noises inside of each of the two SQUIDs cancel each other and the magnetic flux input signals supplied to said two SQUIDs are detected as constructive addition of voltages of the two SQUIDs.

2. The high-sensitive magnetometer as claimed in claim 1, wherein said SQUIDs are DC-SQUIDs, each of which has two Josephson junctions and output terminals on portions of the superconducting loop separated by the Josephson junctions, and the output voltages are generated between the respective terminals.

3. The high-sensitive magnetometer as claimed in claim 1, wherein said SQUIDs comprises superconducting films.

4. The high-sensitive magnetometer as claimed in claim 1 wherein said flux noises inside said SQUIDs are canceled upon output of said voltages from said SQUIDs at output terminals by destructive addition.

5. The high-sensitive magnetometer as claimed in claim 1 wherein said SQUIDs are connected in parallel to said input signals.

6. The high-sensitive magnetometer as claimed in claim 4 wherein said SQUIDs are each biased so as to have voltages of opposite polarities at said output terminals with respect to a reference point located between said SQUIDs.

* * * * *